United States Patent [19]

Adkins et al.

[11] Patent Number: 5,581,495
[45] Date of Patent: Dec. 3, 1996

[54] ADAPTIVE SIGNAL PROCESSING ARRAY WITH UNCONSTRAINED POLE-ZERO REJECTION OF COHERENT AND NON-COHERENT INTERFERING SIGNALS

[75] Inventors: Charles N. Adkins, Falls Church; John J. Turtora, Fairfax, both of Va.

[73] Assignee: United States of America, Washington, D.C.

[21] Appl. No.: 311,675

[22] Filed: Sep. 23, 1994

[51] Int. Cl.$^6$ .................................................. G06F 17/10
[52] U.S. Cl. ........................... 364/724.16; 364/724.07; 364/724.19; 381/92; 381/94
[58] Field of Search ..................... 364/724.01, 724.07, 364/724.19, 724.16; 381/92, 94, 153, 155, 168, 46; 395/2, 2.35, 2.42

[56] References Cited

U.S. PATENT DOCUMENTS

| | | | |
|---|---|---|---|
| 3,109,066 | 10/1963 | David | 379/339 |
| 4,641,259 | 2/1987 | Shan et al. | 364/724.16 |
| 4,802,227 | 1/1989 | Elko et al. | 381/92 |
| 4,956,867 | 9/1990 | Zurek et al. | 381/94 |
| 5,309,378 | 5/1994 | Beicrle | 364/724.19 |

OTHER PUBLICATIONS

Frost, "An Algorithm for Linearly Constrained Adaptive Array Processing" Proceedings of the IEEE vol. 60, No. 8, Aug. 1972 pp. 926–935.

Griffiths et al, "An Alternative Approach to Linearly Constrained Adaptive Beamforming" IEEE Trans. on Antennas & Propagation Jan. 1982 pp. 27–34.

Primary Examiner—Kee Mei Tung
Attorney, Agent, or Firm—Laubscher & Laubscher

[57] ABSTRACT

Broadband coherent and incoherent interfering signals (jammers) are suppressed by using differencing and summing operations in an adaptive signal processing array composed of a plurality of signal detectors. A number of variable weight adaptive filters, equal to or greater than the number of jammers, are applied to all but one of the difference signals. The weighted difference signals are summed and subtracted from the remaining delayed difference signal for processing by an unconstrained adaptive algorithm to adjust the variable weights of the filters. The plurality of detector signals are also grouped by overlapping summing operations to produce summed signals for which all but one are applied to simple filters with the same weighting. These weighted summed signals are themselves summed and subtracted from the remaining delayed summed signal for delivery to a conditioning filter to recover the undistorted desired (target) signal. The differencing operations minimize the number of variable weight adaptive filters required, and provide pole cancellation in the mathematical description of the weighting filters so that the number of weights in the variable weight adaptive filters are also minimized. The summing operations minimize detector thermal noise and provide for the control of beam shape.

6 Claims, 8 Drawing Sheets

FIG. 14B dom # ADAPTIVE SIGNAL PROCESSING ARRAY WITH UNCONSTRAINED POLE-ZERO REJECTION OF COHERENT AND NON-COHERENT INTERFERING SIGNALS The United States Government has rights in this invention pursuant to work performed in the Office of Research and Development, Central Intelligence Agency, and pursuant to Contract No. 93-F144700-000, Central Intelligence Agency.

BACKGROUND OF THE INVENTION

The present invention relates to adaptive signal processing arrays for suppression of coherent and incoherent interfering signals, and more particularly to pole-zero cancellation for realizing maximum efficiency in interference suppression. The invention has applications from RADAR and SONAR arrays to the selection of individual talkers in large auditoriums, conference rooms, or outdoor events such as football games and others.

BRIEF DESCRIPTION OF THE PRIOR ART

Adaptive signal processing arrays employ a plurality of detectors to enhance the target or desired signal and suppress unwanted interference or jamming signals by use of an adaptive processor which automatically adjusts variable weights in adaptive filters acting on the detected signals. Prior systems have mainly been concerned with the difficulty of suppressing jamming signals which are coherent (i.e., having a fixed phase difference) with respect to the desired signal. Such difficulty is exhibited by the method disclosed in Frost "An Algorithm for Linearly Constrained Adaptive Array Processing", Proceedings of the IEFE, Aug. 1972, pp. 926–935 which also requires variable weight filters for each detected signal and requires a constrained adaptive algorithm which prevents the use of commonly available algorithms. An improvement on this method is disclosed in the Elko U.S. Pat. No. 4,802,227 which removes the constraint on the adaptive process, but limits the adaptive algorithm to one special class, known as "negative gradient," so that modern algorithms, e.g., exact least squares and others, are not available. Another improvement on the Frost method is disclosed in the Shah et al. U.S. Pat. No. 4,614,259 wherein spatial averaging, or dithering, is used by means of a plurality of multi-pole switches controlled by a sub-sampling timing device. Here, the added complexity of the switches is compounded by the requirement that there be at least twice as many detectors as signals (desired plus jamming), and that for each detector there must be a weighting filter. It is clear that the complexity and number of weighting filters must grow as detectors are added to the array.

In an entirely different approach disclosed by Griffiths and Jim, "An Alternative Approach to Linearly Constrained Adaptive Beamforming," *IEEE Transactions on Antennas and Propagation*, Vol. AP-30, No. 1, January 1982 difference signals are used to cancel the desired signal at the input to the variable weight filters to minimize the effects of coherent jammers. However, the desired signal is present in the adaptive processor so that adequate performance is achieved only when the desired signal is weak. An attempt to correct this difficulty is disclosed in the Zurek et al. U.S. Pat. No. 4,956,867 wherein a cross correlation device is used to inhibit adaptation of the adaptive processor when the desired signal is present. This method fails to suppress jamming signals when the desired signal is always present, and should the desired signal be sometimes present it is easily defeated by synchronizing the jamming signals to that of the desired signal. It will be shown in the mathematical discussion that in the prior art of Griffiths-Jim and Zurek et al. the number of weights in the variable weight filters must grow, thereby increasing complexity, as detectors are added to the array.

Though the methods of the prior art differ in their attempts to suppress coherent jamming signals and provide for commonly available adaptive algorithms, none provide for both the minimum number of variable weight adaptive filters as well as the minimum number of weights in the adaptive filters. This inefficiency in the prior art places severe restrictions on the processing power required by the adaptive signal processor for real time operation, particularly when a large number of detectors are used in the array.

SUMMARY OF THE INVENTION

Accordingly, it is a primary object of the present invention to suppress both coherent and incoherent broadband jamming signals while preserving a broadband omnipresent desired signal which can be strong or weak. Differencing operations on the detector signals provide for both the minimum number of variable weight adaptive filters as well as the minimum number of variable weights which can be adjusted by any commonly used adaptive algorithm. The characterizing feature of the invention is the ability to cancel poles in the mathematical description of the adaptive filters and thus provide minimum length adaptive filters whose lengths are functions only of the spatial positions of the jammers and not on the number of detectors in the array. This allows minimum complexity in using a large number of detectors whereby summing operations on the detected signals recover the desired signal, reduce the effects of sensor thermal noise, and provide for the control of beam shape.

BRIEF DESCRIPTION OF THE FIGURES.

Other objects and advantages of the invention will become apparent from a study of the following specification when viewed in the light of the accompanying drawing, in which.

DETAILED DESCRIPTION

Figure 1:
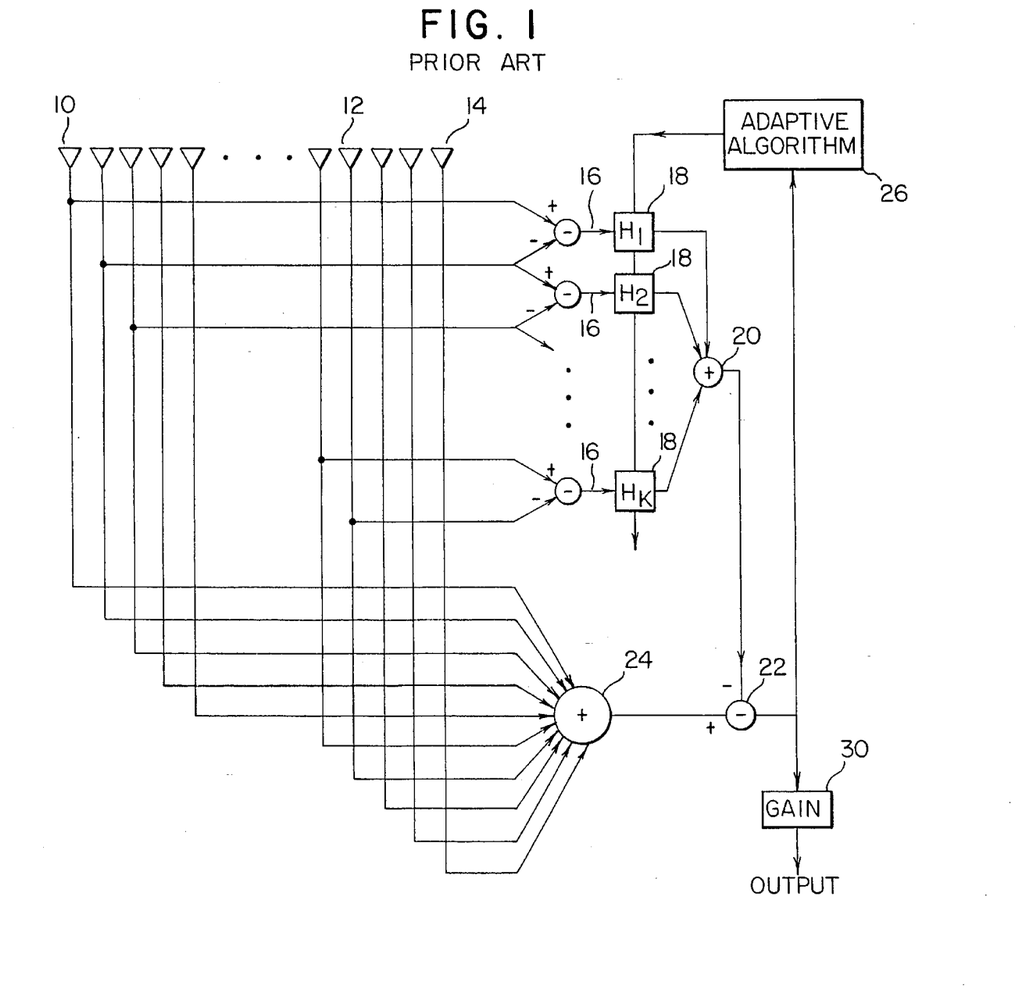
FIG. 1 is a schematic diagram of an adaptive array according to the prior art.
Figure 2:
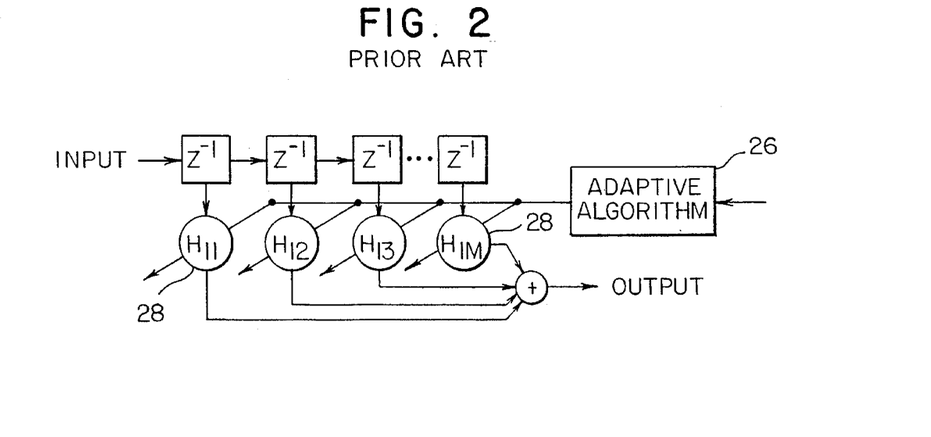
FIG. 2 is a schematic diagram according to the prior art when the adaptive algorithm is active.

There is shown in FIG. 1 a schematic diagram of the Griffiths-Jim processing array and in FIG. 2 the Zurek et al processing array when adaptation is allowed to take place (i.e. when the desired signal is not present). The array includes K+1 detectors 10–14 for forming K difference signals 16 for use as inputs to K variable weight adaptive filters 18 for the suppression of K jamming signals. An adder 20 combines the filtered signals and applies them to a differencing node 22. Furthermore, the signals from all of the detectors 10–14 are combined at an adder 24 and applied to the differencing node 22 to form a difference signal for use by the adaptive algorithm 26 to adjust the weights 28 of the adaptive filters 18. The difference signal from 22 is amplified 30 to form a suitable replica of the desired signal only when the desired signal is weak (Griffiths-Jim) or not present during adaptation (Zurek et al.).

Figure 3A:
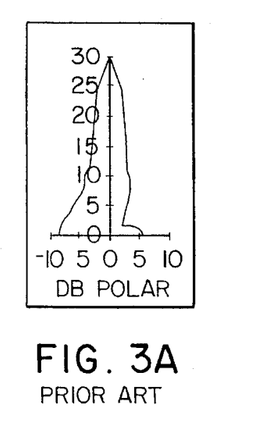
FIGS. 3A and 3B are graphical representations of the antenna (beam) patterns under ideal conditions for the prior art processing arrays.
Figure 3B:
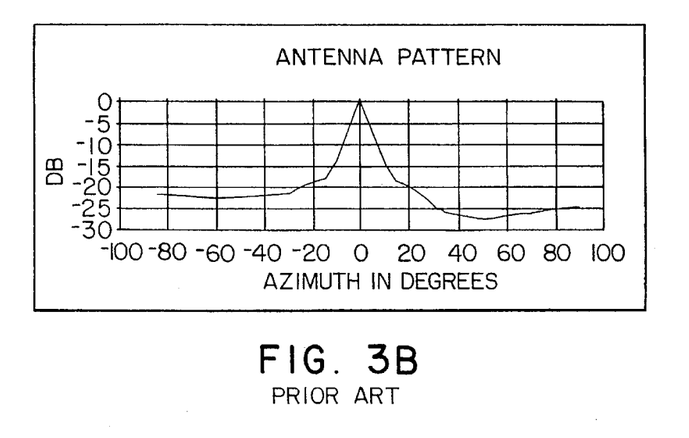

FIGS. 3A and 3B are plots, at 5° spacing, of a computer simulated wideband antenna pattern for the prior art in FIG. 1 with signals of equal strength in the band 800 to 3200 Hz. An array of sixteen detectors is adapted for one jammer located at 45° from the array perpendicular with the desired signal at zero degrees. Every advantage is given to the prior art in that adaptation of the desired filter takes place only when the desired signal is absent. The plot represents the best jammer suppression from all prior art with one variable weight adaptive filter containing 5 variable weights and for detector thermal noise 30 dB below the signal received by each detector.

Figure 4A:
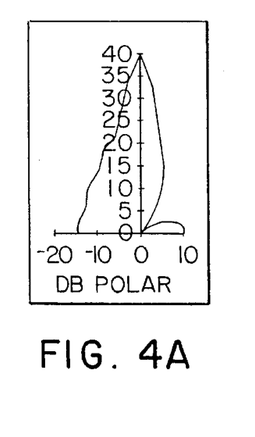
FIGS. 4A and 4B are graphical representations of the antenna (beam) patterns for the processing array of the present inventions.
Figure 4B:
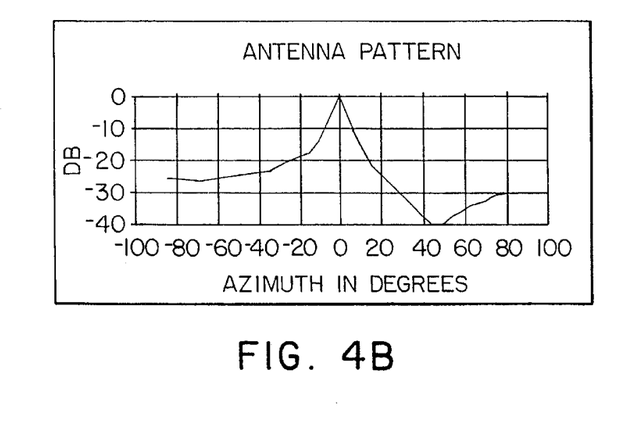

FIGS. 4A and 4B are plots of the antenna pattern for the invention with the same conditions described in FIG. 3, except that the desired signal is always present and may be coherent with the jamming signal at all frequencies. It is seen in this case that the null at 45° for jammer suppression is almost 14 dB better than that of all prior art, with one adaptive filter and 5 variable weights, and close to the maximum theoretical possible (−42 dB) for sixteen detectors, each with −30 dB thermal noise with respect to the received signals. It will be shown in the mathematical analysis that under fortuitous conditions of digital sample rate, the suppression of the jammer will achieve the maximum theoretical possible to within the accuracy of the computer's calculations.

Figure 5:
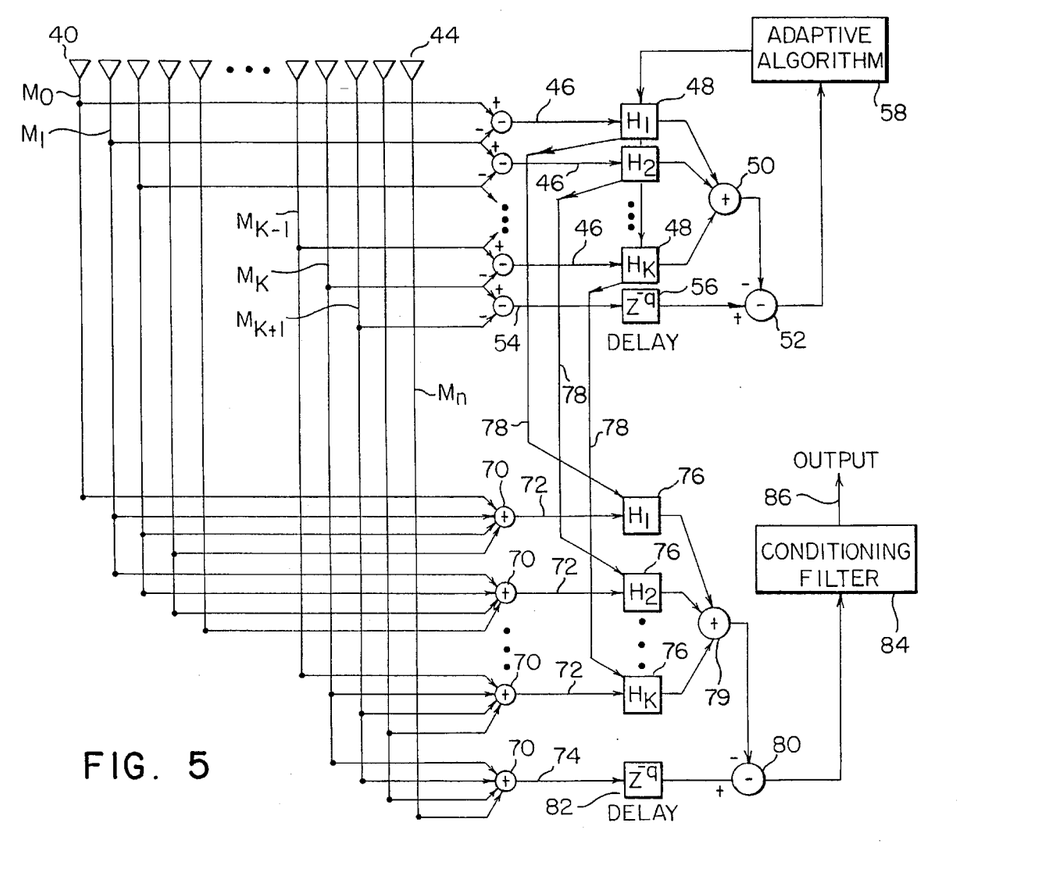
FIG. 5 is a schematic diagram of the adaptive signal processing array of the present invention.
Figure 6:
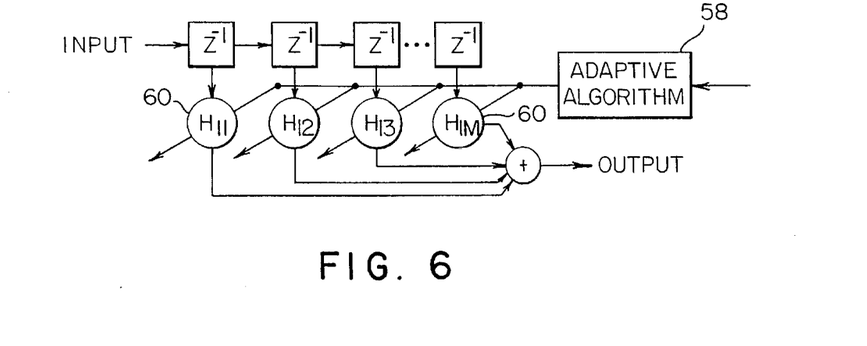
FIG. 6 is a block diagram illustrating the adaptive weighting for the filters of the processing array of the invention.

In FIG. 5 is shown a representative schematic of the invention. In this embodiment there are n+1 detectors 40–44 which produce signals labeled $M_0$ through $M_N$. For K or less jamming signals, K differencing signals 46 are produced by the differencing operation $M_0-M_1$ for the first difference signal 46 and $M_{K-1}-M_K$ for the K th difference 46. These signals are weighted by K variable weight adaptive filters 48 and combined in an adder 50 for application to the differencing node 52. An additional differencing signal 54 is produced by the operation $M_K-M_{K+1}$ which is delayed by delay 56 and applied to the differencing node 52 to form a signal for use by the adaptive algorithm 58 to adjust the variable weights 60 of the adaptive filters 48 as shown in FIG. 6. Signals from all of the detectors 40–44 are formed into K+1 overlapping groups of n+1−K signals and applied to the adders 70. The signals 72 from the first K adders are applied to the K non-adaptive weighting filters 76 whose weights are copied from the adaptive weights 60 in the adaptive filters 48 by means of connections 78, which may be active as often as each time instant. The K weighted signals are summed at adder 79 and applied to the differencing node 80. The last summed signal 74 is delayed by delay 82 and applied to differencing node 80 for use by the conditioning filter 84 to produce the undistorted desired signal as the output 86. The fixed delay parameter q in the delay devices 56 and 82 is chosen to equalize suppression of jamming signals coming from all possible unknown directions in relation to the known direction of the desired signal.

Figure 7A:
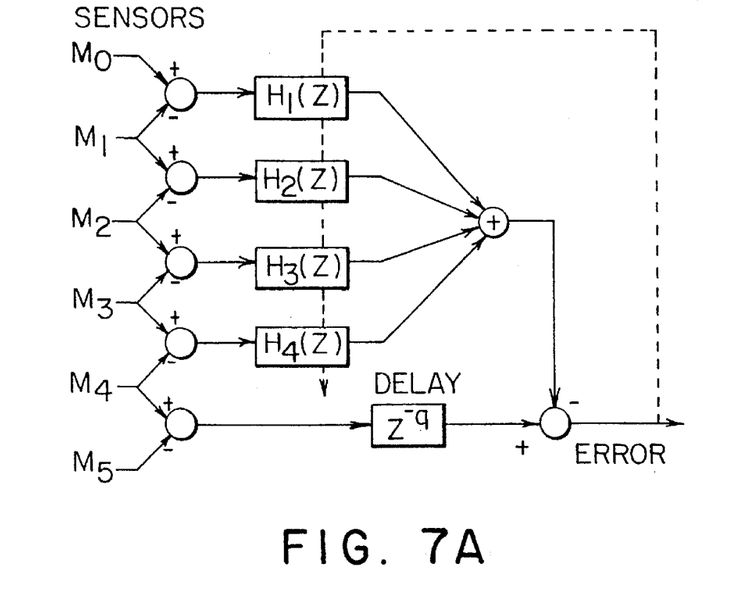
FIGS. 7A and 7B are block diagrams, respectively, illustrating one embodiment for four, or less, jammers and sixteen detectors in the array of FIG. 5 for use with the mathematical analysis.
Figure 7B:
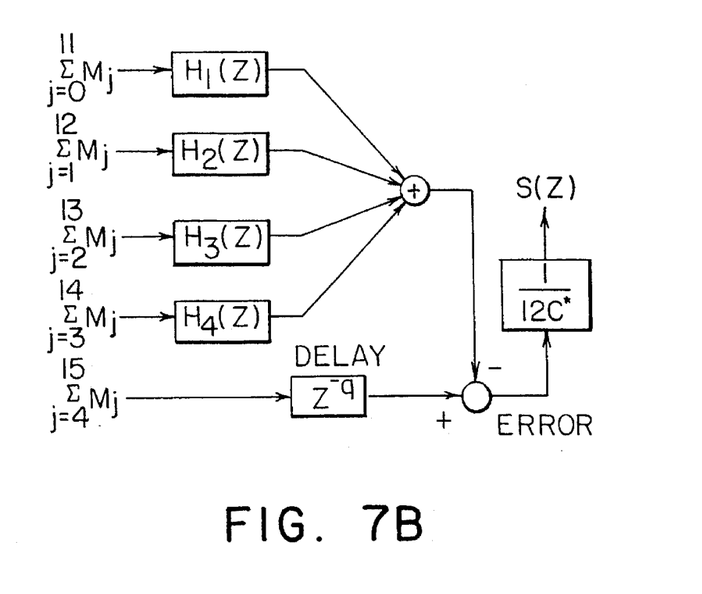

FIGS. 7A and 7B are block diagrams for the differencing and summing operations, respectively, in FIG. 5 for the explicit case of sixteen sensors with signals denoted by $M_0$ through $M_{15}$ and with operations configured to suppress four, or less, jamming signals.

Returning to FIG. 5, it is seen that only K variable weight adaptive filters 48 are required to suppress K jamming signals and that all K+1 differencing signals 46 and 54 are devoid of the desired signal. A primary innovation of the invention is the additional differencing signal 54 which allows the variable weight filters 48 to be adapted, without influence of the desired signal, by any commonly used unconstrained adaptive algorithm 58. It is now apparent that K nulls can be placed in the unknown directions of K jamming signals even though they may be coherent with the desired signal, including the case of reflections (multi-path) of the desired signal. It will be shown in the following analysis that this innovation cancels the poles in the mathematical description of the adaptive filters 48, thereby permitting a minimum number of adaptive weights 60 for adequate performance of the invention. It is also seen here that the summing operations 70 span all sensors 40–44 so that the entire array aperture is used for reduction of detector thermal noise and control of beam shape. The complexity of the adaptive processor 58 does not increase as sensors are added to the array, and the number of sensors may be as few as K+2.

The following is a mathematical analysis of the adaptive signal processing array in accordance with the invention.

Figure 10:
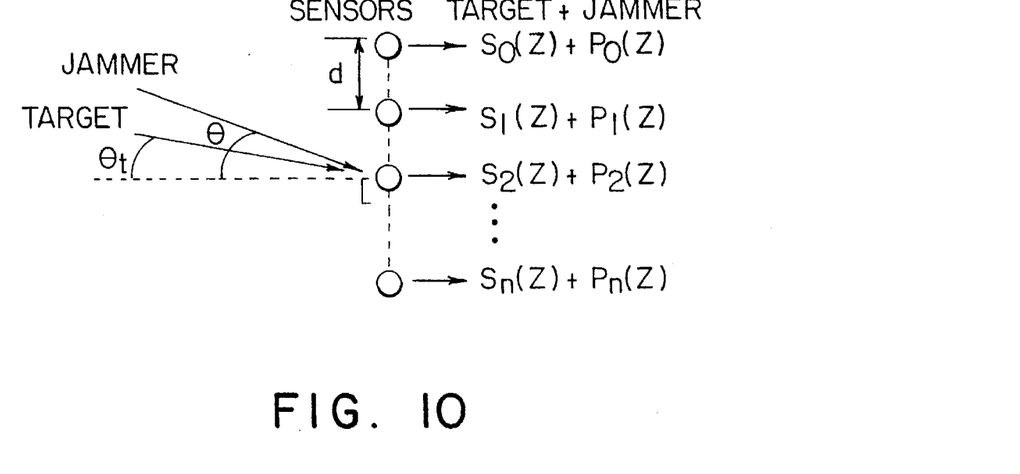
FIG. 10 is a schematic representation of the geometry of a linear equally spaced array of sensors.
Figure 11:
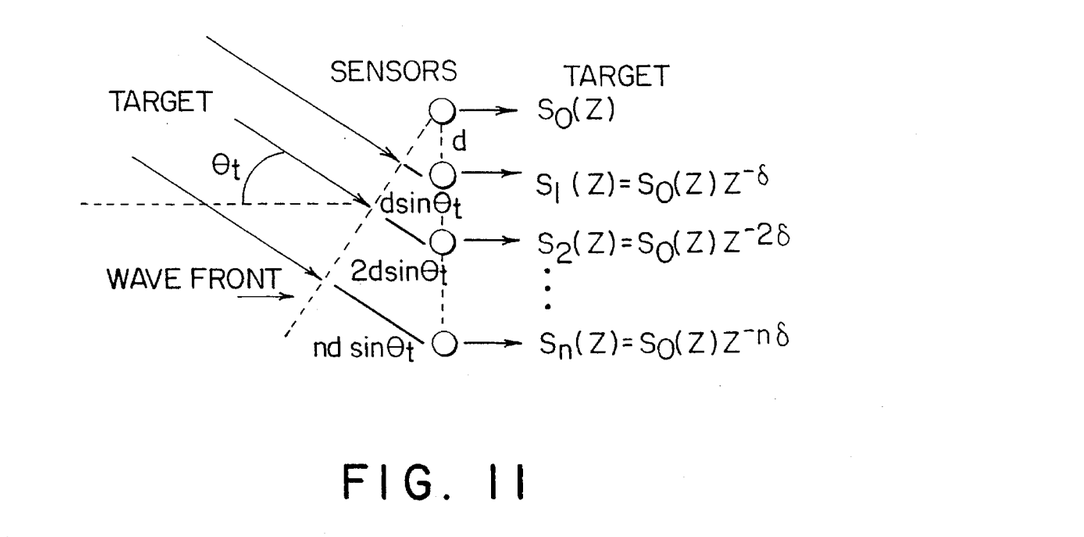
FIG. 11 is a schematic representation of the signals from the sensors of FIG. 10.

Consider a linear, equally spaced, array of n+1 sensors numbered zero through n. The Z transform of the time sampled data vector for sensor j is taken as $S_j(Z)+P_j(Z)$, where $S_j(Z)$ is due to the target signal at angle $\theta_t$ from the perpendicular and $P_j(Z)$ is due to the jammer at angle $\theta$. The array geometry is shown in FIG. 10. The signals are assumed to arrive from the far field as plane waves, shown in FIG. 11 for the target. The sample delay between sensors for the target is $$\delta = (rd/c)\sin\theta_t \qquad (1)$$

where r is the digital sample rate, d is the sensor spacing, and c is the wave front propagation velocity. In order to steer the array toward the target, it is necessary to add sample delays of $-j\delta$ to each sensor in FIG. 10 so that each $S_j(Z)Z^{j\delta}$ in FIG. 11 is equal to $S_0(Z)$. Since the jammer must also pass through these steering delays, the output of each delayed sensor can be written as $$M_j(Z)=S(Z)+P_o(Z)Z^{j\Delta}, j=0, n \quad (2)$$

where $\Delta$ is the combined jammer delay $$\Delta=(rd/c)(\sin\theta-\sin\theta_t) \quad (3)$$

and $S(Z)+P_0(Z)$ is the signal in the first sensor. We can now compose the generalized sensor output with k jammers and the inclusion of thermal noise $N_j$:

$$M_j(Z) = S(Z) + N_j(Z) + \sum_{i=1}^{k} P_{oi}(Z)Z^{-j\Delta_i}, j=0,n \quad (4)$$

where $$\Delta_i=(rd/c)(\sin\theta_i-\sin\theta_t), i=1,k \quad (5)$$

defines the sample delay for each jammer. It is significant to point out that the target is completely correlated between two different sensor outputs, whereas the thermal noise is completely uncorrelated.

The basic array is defined as the sum of $M_j$ for j=0,n. Let the target power at one sensor be E(S) and that for thermal noise be E(N). The target signal to thermal noise ratio at the input is then $$SNR[E(S)/E(N)]=10\log[E(S)/E(N)] \quad (6)$$

which defines the SNR operator in dB. Since the target is perfectly correlated in each sensor, the array output power is $E_A(S)=(n+1)^2E(S)$, whereas the thermal noise output is only $E_A(N)=(1+n)E(N)$. For no jamming signals, the array output SNR is.

It is apparent that for an array of 16 sensors, $$SNR[E_A(S)/E_A(N)]=SNR[E(S)/E(N)]+SNR(1+n) \quad (7)$$

the output SNR will increase 12 dB over that of only one sensor. Next, consider the effects of one or more jammers with combined input power E(P) at one sensor and $E_A(P)$ at the array output. The total input SNR is now $$SNR[E(S)/\{E(N)+E(P)\}]=SNR[E(S)/E(N)]-SNR[1+E(P)/E(N)] \quad (8)$$

and the total output SNR, for any array, can be partitioned as $$SNR[E_A(S)/\{E_A(N)+E_A(P)\}]=SNR[E_A(S)/E_A(N)]-SNR[1+E_A(P)/E_A(N)] \quad (9A)$$

The first term on the right represents the maximum possible output SNR and the last provides the degradation due to the array's inability to cancel the jamming signals. This relation can be paraphrased for later use as $$SNR(out)=SNR(max)-SNR,(down) \quad (9B)$$

Figure 12:
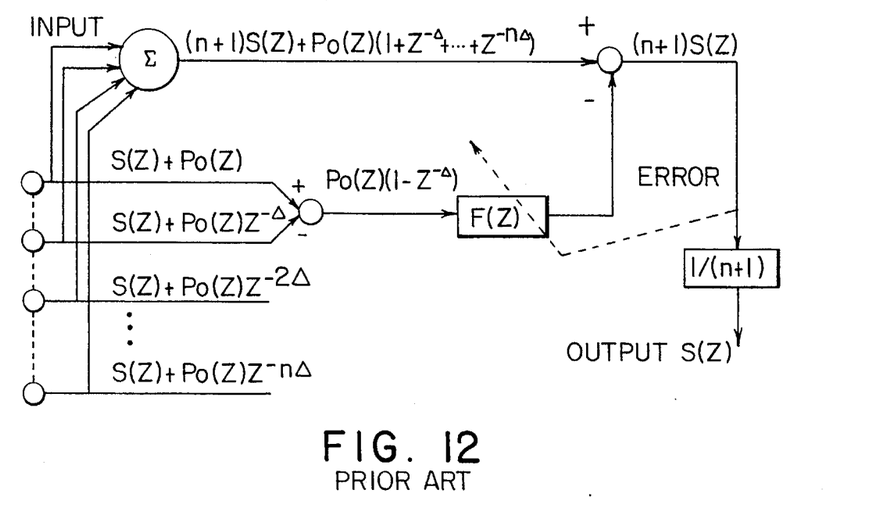
FIG. 12 is a schematic representation of the prior art Griffiths-Jim array of sensors for one jammer.

FIG. 12 shows a Griffiths-Jim (G-J) array of n+1 sensors, one adaptive filter F(Z) for one jammer, and where thermal noise is neglected. Assuming no correlation between target and jammer, it can be seen that minimum energy in the error will occur for $$F(Z)=(1+Z^{-\Delta}+\ldots+Z^{-n\Delta})/(1-Z^{-\Delta}) \quad (10)$$

For F(Z) to be adequately approximated by an FIR adaptive filter, the pole $(1-Z^{-\Delta})$ must be expanded into the numerator and convolved with the zero polynomial. This can result in a large number of taps, or filter weights, for a good estimate. It is further shown by Duvall, "Signal Cancellation in Adaptive Antennas," *Ph.D. Dissertation, Dept. of Elect. Eng., Stanford Univ.*, June 1983, that since S(Z) is present in the error signal, those frequencies which may have correlation with the jammer can be canceled in the output. Gooch, "Adaptive Pole-Zero Filtering: The Equation Error Approach," *Ph.D. Dissertation, Dept. of Elect. Eng., Stanford Univ.*, June 1983, pp. 99–114, discussed an "equation error" approach for an additional filter, the pole filter, for eliminating the pole polynomial in F(Z). However, this additional filter has S(Z) in its input which can cause serious degradation in the predictable components, called "look direction bias." In any case, the number of taps must grow as more sensors are added to the array to control thermal noise or beam shape. It will be shown that when the number of filter taps is small, for practical reasons, the term representing SNR(down) in Eq. (9) can be quite large. This can be compounded by a lower SNR(max) term due to an increase in output thermal noise caused by F(Z). For short filters, the output SNR of the G-J array may show only a trivial improvement over simply summing the sensor outputs. This will be demonstrated below.

Figure 13A:
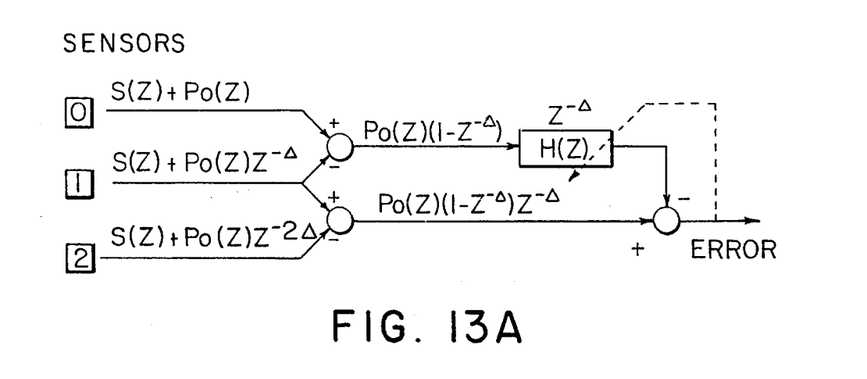
FIG. 13A is a schematic representation of the adaptive filter and the inputs thereto for suppressing one jammer according to the invention.
Figure 13B:
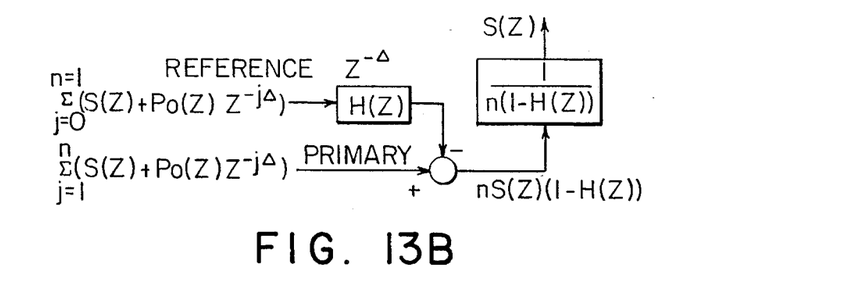
FIG. 13b is a schematic representation of the simple non-adaptive filter used to recover the target signal in the presence of one jammer according to the invention.

In the current invention the process takes place in two steps. First, there are differencing and adaptive operations where the adaptive filters are determined with no target signal present. These filters are then used with summing or analysis operations which include the target and attempts to cancel the jammers. The adaptive filter weights are copied from the adaptive to the analysis process at periodic intervals which can be as short as the digital sampling rate. The solution for one jammer is exceedingly simple and can be seen in FIG. 13. In FIG. 13A the filter H is adapted from any three consecutive sensors by using the difference channels devoid of target signal. It is apparent that for minimum error, H(Z) must equal $Z^{-\Delta}$. This is used in FIG. 13B to recover S(Z) in the output. The primary or unfiltered channel is the sum over the last n sensors whereas the reference or filtered channel is the sum over the first n sensors. These sums are important for controlling beamwidth and reducing the effect of thermal noise in the output. It is again apparent, as far as the jammer is concerned, that the primary is but a delayed version of the reference and, for $\Delta$ equal to a positive integer, the filter H will contain a unit impulse at the position $\Delta$. Neglecting thermal noise, the jammer is completely canceled and only the target survives in the error signal. The undistorted target signal is recovered by inverting the filter 1-H(Z). In general, $\Delta_i$ is not an integer but is bounded by Eq. (5). Since $\Delta_i$ can be negative, it is necessary to apply a delay $Z^{-q}$ to the primary channels in both FIGS. 13A and 13B where q is an integer equal to about half the length of H when $\theta_t$ is zero. This allows the direction of the jammer to be completely arbitrary and unknown. For the length of H an odd integer, choosing q as the position of the center tap gives equal weight to positive and negative values of $\Delta_i$ for zero $\theta_t$.

The derivation of the pole canceling properties for the inventive array for arbitrary numbers of jammers is given in the Appendix. FIG. 7 shows an explicit design for 16 sensors (numbered zero to 15) and 4 jammers where $M_j$ is the generalized sensor output in Eq. (4). It is seen in FIG. 7A that the filters H are adapted in the presence of thermal noise, but no target signal is present. No theoretical advantage is gained by grouping sensors prior to forming the difference channels. When the jammer is not strong in comparison to thermal noise, the increase in output SNR over that of the prior array is small. In FIG. 7B, the target is present in all channels and the sums increase its ratio to thermal noise in the output and control beamwidth. It is shown in the Appendix that the characteristic polynomial is $$C^*(Z) = Z^{-q} - \sum_{i=1}^{k} H_i(Z) \tag{11}$$

with factors $(1-Z^{-\Delta_i})$ for each of the k jammers. Its inverse recovers the undistorted target signal. The positive integer q is chosen so that $\Delta_i+q$ is sufficiently positive for all jammer directions in Eq. (5). It is significant that as the number of sensors increases, the number of filter weights need not. It is also pointed out that if thermal noise and beamwidths are not a concern, then the sums in FIG. 7B can be replaced with consecutive sensor outputs.

For speech signals there are arguments to forgo the necessity of the inverse filter. It acts as a differentiator to boost the high frequencies, not unlike the "treble" on a car radio used to deal with low frequency background noise. In any case, H and C* are short (on the order of a millisecond) and the inverse filter can be recovered in a length of about eight milliseconds. Only frequencies within the pass band, that are also larger than the noise floor, need be inverted. This can be done post analysis or, approximately, with a fixed equalizer.

The invention has been tested using a number of computer simulations. Sixteen equally spaced sensors were chosen with a transit time (d/c) of 1/4000 of a second and a digital rate of 8000 samples per second. Thus, equation (5) becomes $$\Delta_i=2(\sin \theta_i-\sin \theta_t) \tag{12}$$

for the delay of a jammer at $\theta_i$. All signals are arbitrarily chosen to have a flat frequency response in the band 800 to 3200 Hz and zero elsewhere. The phase spectrums are chosen at random with a uniform distribution between zero and $2\pi$. The delayed jammer signals, for use in Eq. (4), are determined by imposing a linear phase shift associated with $j\Delta_i$ for the i th jammer at the j th sensor. The inverse FFT determines the time signals for composing the generalized broadband sensor outputs $M_j$. These time signals are necessarily periodic. However, all analyses, adaptations, and averages are determined by use of about the first 1000 points, which is less than one period. For the purpose of plotting antenna patterns, we define $$M_j=N_j(Z)+P_0(Z)Z^{-\Delta_i} \tag{13}$$

for selected values of $\theta_i$ in Eq. (12). When $\theta_i$ equals $\theta_t$, $P_0(Z)$ acts as the target signal $S(Z)$. If the output at $\theta$ is then compared to that at $\theta_t$, the result is a corrupted form of output SNR for the special case of equal input target and jammer strength (the numerator in Eq. (9) has and extra noise term).

EXAMPLE 1

If the target is at zero degrees with a signal to thermal noise ratio of zero dB in one sensor, and that of a jammer at 45° is 30 dB, find SNR(out).

The value for SNR(max) in Eq. (9) should be about 12 dB for 16 sensors. For the basic array with 16 sensors, the computer solution to Example 1 is $$SNR(\text{out})=12.1-17.8=-5.7 \text{ dB}$$

For a speech target, the output would not be intelligible. When the jammer is reduced from 30 to 20 dB, SNR(out) increases from −5.7 to 3.7 dB. When it is further reduced to 10 dB, the result is 10.0 dB, an acceptable result for speech assuming no other background noises are present.

For the Griffiths-Jim array, the filters are adapted in the presence of thermal noise, but with no target signal present. Since the target is present in practice, the computer results may be somewhat optimistic (see Widrow et al., "Signal Cancellation Phenomena in Adaptive Antennas: Causes and Cures," *IEEE Transactions on Antennas and Propagation*, Vol. AP-30, No. 3, May 1982). During adaptation, k filters can be composed for k (or less) jammers. These filters are then frozen and Eq. (13) is used to generate pattern outputs for selected angles. FIG. 3 shows the pattern for one filter of 5 taps adapted for a jammer at 45° and with a delay of q=2 in the primary channel. The computer solution in Example 1 is determined by applying each signal individually in Eq. (4) to the adapted array and observing the separate outputs. The result for the array of the Griffiths-Jim is $$SNR(\text{out})=12.1-15.2=3.1 \text{ dB}$$

or about 2.5 dB better than the basic array. It is apparent that only 5 taps are not enough to sufficiently estimate Eq. (10) with an FIR adaptive filter. When the input jammer strength is reduced to 10 dB above thermal noise, only a 0.7 dB improvement over the basic array is observed. On the other hand, when the number of taps is increased from 5(q=2) to 21(q=10), the output SNR increases from −3.1 to only −1.7 dB.

In the present invention, the filters are adapted according to FIG. 7A in the presence of thermal noise and then frozen for use in FIG. 7B. For general problems, individual components of Eq. (4) are input to the array and the outputs observed. Antenna patterns use Eq. (13). The pattern for 5 taps (q=2), adapted for a jammer at 45°, is shown in FIG. 4. The computer solution to Example 1 for the inventive array is $$SNR(\text{out})=12-1.5=10.5 \text{ dB}$$

Figure 8:
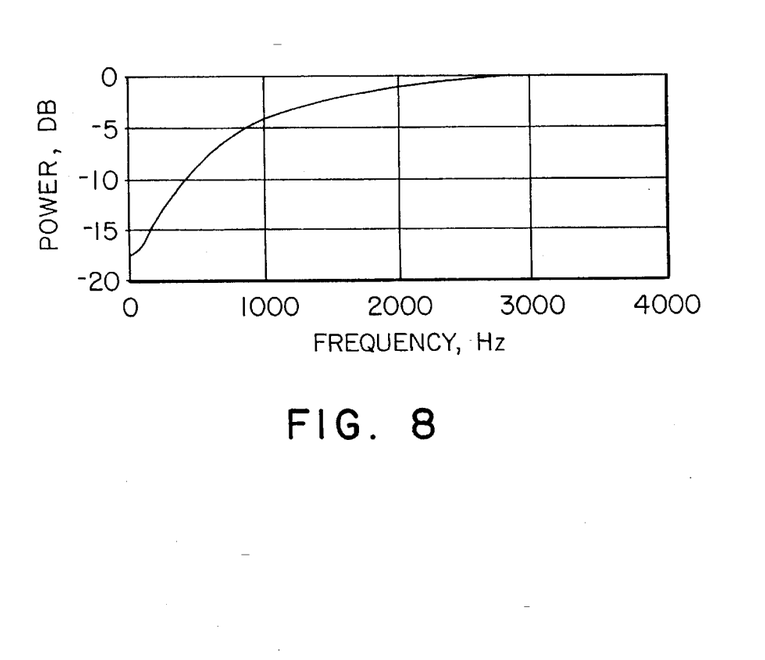
FIG. 8 is a graphical representation of the frequency response for the inverse of the conditioning filter of FIG. 5 as applied to the conditions producing FIGS. 4A and 4B.

This is an improvement over the G-J array of 13.6 dB. If the target signal were speech, the output would be intelligible. When the jammer input is reduced to 10 dB, SNR(out) increases to its maximum of 12 dB, an improvement over the basic array of about 2 dB. Computer simulations indicate that as the jammer level increases from 10 dB above thermal noise to infinity (the thermal noise approaches zero) the improvement in SNR(out) over the Griffiths-Jim array increases from 2 to 21.5 dB. For the same conditions, the improvement over the G-J array increases from about 1 dB to 19 dB. FIG. 8 shows the frequency response for the characteristic filter $Z^{-2}-H(Z)$.

EXAMPLE 2

Consider four adaptive filters with all other conditions the same as in Example 1. The number of taps in each filter is 5 with a delay q=2. Determine the output SNR for the two adaptive arrays.

For the G-J array the computer solution is SNR(out)= 8.1−10.8=31 2.7dB. It is seen that the SNR(max) term of 8.1 dB has been reduced over that of one filter. This is due to adverse effects of thermal noise passing through the extra filters. This difficulty with the G-J array is discussed by Gooch, pp. 83–85.

The solution for the inventive array is SNR(out)=11.2–0.01=11.2 dB.

EXAMPLE 3

Consider four jammers at $\mp 45°$ and $\mp 20°$. The target level is zero dB above thermal noise and that of each jammer is 30 dB. Other conditions are the same as in Example 2. Sum the effects of the target, thermal noise, and each jammer to determine output SNR. Each filter has 5 taps with a primary delay q=2.

The solution for the basic array is SNR(out)=12.1–27=–14.9 dB.

The G–J array result is SNR(out)=8–21.1=–14.9 dB.

Figure 9A:
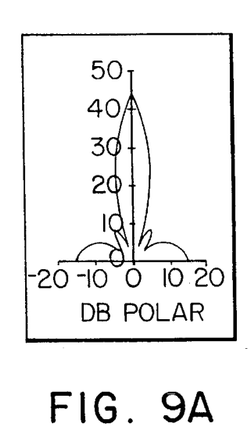
FIGS. 9A and 9B are graphical representations of the antenna (beam) pattern for four jamming signals in accordance with the invention as applied to the remaining conditions producing FIGS. 4A and 4B.
Figure 9B:
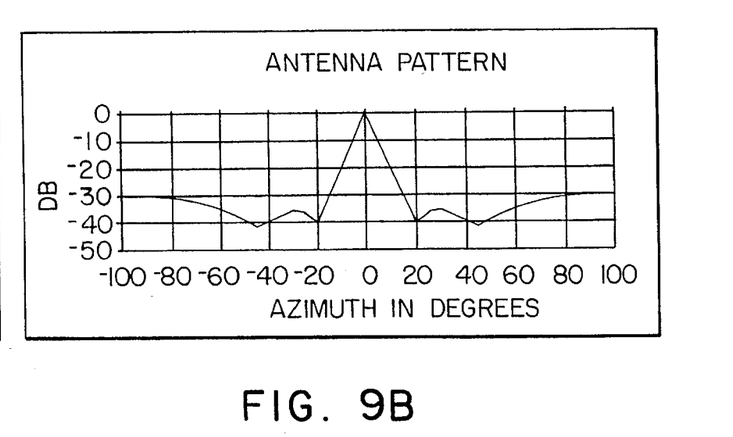

For the inventive array we have SNR(out)=11.3–0.4=10.9 dB with the antenna pattern shown in FIG. 9.

EXAMPLE 4

Consider the conditions for Example 1, but with the target at –60°. For a jammer at 45°, the delay $\Delta$ is now 3.1 samples. Show variations in the inventive array SNR(out) for different filter lengths and primary delays q.

For the basic array, the computer solution for SNR(out) is –18.2 dB. Table 1 shows SNR(out) for the inventive array with different filter lengths and delays q. It is seen in Table 1 that for 9 taps, q=3 (6 causal taps) is almost too large for $\Delta$=3.1. It would appear that when the target is off the array perpendicular, good jammer cancellation is possible with 9 taps if we let q vary from about 2 to 7 as the target direction varies from –90° to +90°. Since the target direction is known, this should not be a problem.

TABLE 1

| | A-T SNR(out) | | | |
|---|---|---|---|---|
| DELAY$_q$ | 1 | 2 | 3 | 4 |
| #TAPS | | | | |
| 5 | 4.3 | –15 | | |
| 7 | 8.9 | 6.7 | –0.6 | |
| 9 | 11.3 | 11.3 | 11.3 | 9.6 |

In an outdoor acoustic environment, conditions are seldom stationary. Shifting wind directions and moving target and jammer sources require fast adaptation for the adaptive filters. To accomplish this in real-time indicates the need for a multichannel, fast, exact least squares algorithm. The results of this analysis used the adaptive algorithm of Slock et al., "Modular and Numerically Stable Fast Transversal Filters for Multichannel and Multiexperiment RLS," *IEEE Transactions on Signal Processing*, Vol. 40, No. 1, April 1992. Programing this algorithm onto the Motorola 96001 DSP indicates that about 15 taps in each of four filters can achieve real-time processing with three chips. To use the inventive array with a Lattice structure, the adapted reflection coefficients need only be copied to an analysis Lattice. The Lattice (see Lev-Ari, "Modular Architects for Adaptive Multichannel Lattice Algorithms," *IEEE Transactions on Acoustics, Speech, and Signal Processing*, Vol. ASSP-35, No. 4, April 1987, and Petropulu et al., "Efficient Realization Structure of the Apriori Lattice-Ladder Recursiva Least Squares Algorithm," *IEEE Transactions on Signal Processing*, Vol. 39, No. 4, April 1991), or QR Lattice (see McWhirter, "Algorithmic Engineering in Adaptive Signal Processing," *IEE Proceedings-F*, Vol. 139, No. 3, June 1992), is certainly a candidate for real-time processing by use of Transputer chips (see Proudler, "Adaptive Acoustic Beamformer Design Study," *Interim Report*, DRA, Malvern, Oct. 1991) in a systolic array structure. It has been shown by computer simulation that the T850-30 Transputer can implement a QR Lattice in real-time, at 8000 samples per second, with two chips for one tap in each of four channels; about 20 chips to solve the problem in Example 4. The new T9000 Transputer provides at least two taps in each of four channels, per chip. If the FIR coefficients are needed, they can be recovered by back substitution in the QR form of the normal equations, or by a more efficient means described by Alexander and Ghirnikar, "A Method for Recursiva Least Squares Filtering Based Upon an Inverse QR Decomposition," *IEEE Transactions on Signal Processing*, Vol. 41, No. 1, Jan. 1993.

Applications vary from RADAR, to towed SONAR arrays, to various requirements for remote speech data acquisition. Though procedures imply a known target direction, precise bearing can be determined by a "super resolution" search (see Widrow et al., "Adaptive Signal Processing." *Prentice Hall*, 1985, Chap. 14). The super resolution beamwidths for the current invention were determined by computer solution to be about one degree for one filter, and less than a quarter of a degree for four filters.

APPENDIX

Figure 14A:
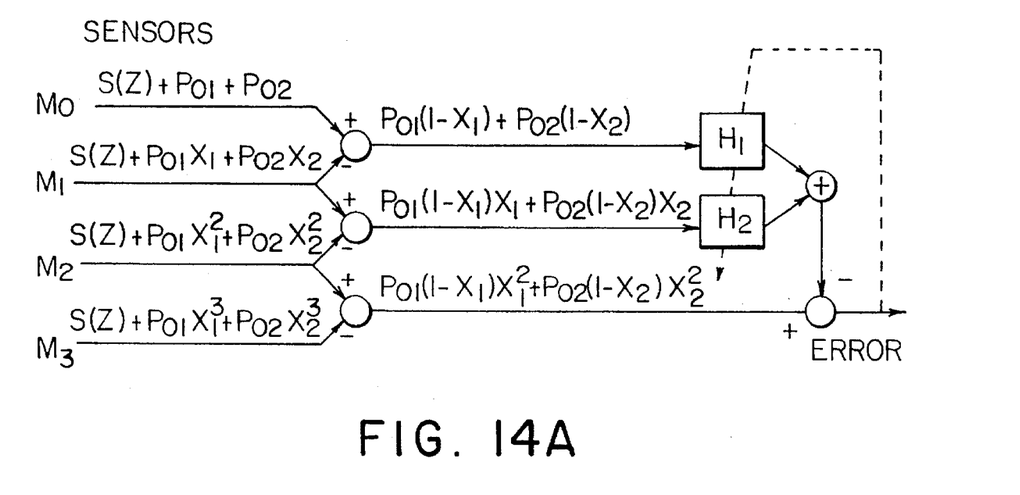
FIG. 14A is a schematic representation of adaptive processing for two jammers according to the invention.

Consider the generalized sensor outputs in Eq. (4) with no thermal noise. FIG. 14A shows the adaptive process for two jammers, which uses any four consecutive sensors. For the jammers to cancel in the error signal, H must satisfy $$(A1) \begin{pmatrix} 1 & X_1 \\ 1 & X_2 \end{pmatrix} \begin{pmatrix} H_1 \\ H_2 \end{pmatrix} = \begin{pmatrix} X_1^2 \\ X_2^2 \end{pmatrix}, X_i = Z^{-\Delta_i}$$

The filter solutions are $$H_1 = -X_1 X_2, \quad H_2 = X_1 + X_2$$

Note that the characteristic polynomial is $$C^* = 1 - H_1 - H_2 = (1 - Z^{-\Delta_1})(1 - Z^{31\, \Delta_2})$$

and contains the product of the poles.

Theorem:
For k jammers, H must satisfy $$\begin{pmatrix} 1 & X_1 & \cdots & X_1^{k-1} \\ \cdot & \cdot & & \cdot \\ \cdot & \cdot & & \cdot \\ \cdot & \cdot & & \cdot \\ 1 & X_k & \cdots & X_k^{k-1} \end{pmatrix} \begin{pmatrix} H_1 \\ \cdot \\ \cdot \\ \cdot \\ H_k \end{pmatrix} = \begin{pmatrix} X_1^k \\ \cdot \\ \cdot \\ \cdot \\ X_k^k \end{pmatrix}, X_i = Z^{-\Delta_i}$$

and the solutions for H have no poles. This theorem can be proven recursively by showing that if rank k–1 has this property, then rank k has this property. Also, it has been verified empirically for k=4 with symbolic software (muMATH).

Corollary:
The characteristic polynomial for rank k is $$C^* = 1 - \sum_{i=1}^{k} H_i = \prod_{i=1}^{k} (1 - Z^{-\Delta_i})$$

Figure 14B:
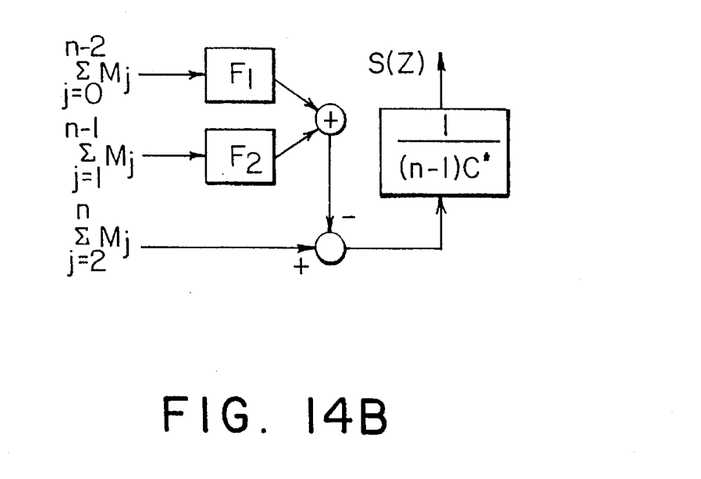
FIG. 14B illustrates the analysis process for two jammers with no adaptation.

FIG. 14B shows the analysis process for two jammers. We use the identity $$\sum_{j=k}^{n} P_{0i} X_i^j \equiv P_{0i}(1 - X_i^{n+1-k}) X_i^k/(1 - X_i)$$

where, again, $X_i = Z^{-\Delta i}$. The first sum channel, the input to $F_1$ in FIG. 12B, is the sum of the first (n+1)–2 sensors:

$$\sum_{j=0}^{n-2} M_j = (n-1)S + P_{01}\frac{(1 - X_1^{n-1})}{(1 - X_1)} + P_{02}\frac{(1 - X_2^{n-1})}{(1 - X_2)}$$

The second filtered channel, the input to $F_2$, is the sum of the second set of (n+1)–2 sensors:

$$\sum_{j=1}^{n-1} M_j = (n-1)S + P_{01}\frac{(1 - X_1^{n-1})}{(1 - X_1)} X_1 + P_{02}\frac{(1 - X_2^{n-1})}{(1 - X_2)} X_2$$

and the last filtered channel, the primary, is the sum of the last set:

$$\sum_{j=2}^{n} M_j = (n-1)S + P_{01}\frac{(1 - X_1^{n-1})}{(1 - X_1)} X_1^2 + P_{02}\frac{(1 - X_2^{n-1})}{(1 - X_2)} X_2^2$$

For the jammer signals to cancel in the error signal, F must satisfy:

$$\begin{pmatrix} 1 & X_1 \\ 1 & X_2 \end{pmatrix} \begin{pmatrix} F_1 \\ F_2 \end{pmatrix} = \begin{pmatrix} X_1^2 \\ X_2^2 \end{pmatrix}, X_i = Z^{-\Delta i}$$

From Eq. (A1), it is clear that $$F = H$$

and that the inverse of C* will recover the undistorted signal. FIG. 7 shows the adaptation and analysis process for 16 sensors and four jammers.

While the invention is described for use with a line array of detectors, those practiced in the art will understand that the embodiments described above can be applied to different arrangements and modifications without departing from the scope and spirit of the invention: for example, that a two dimensional array composed of horizontal line arrays of one spacing and vertical line arrays of the same, or different, spacing can be used whereby each horizontal array is processed in the manner described by the invention and used as inputs to a vertical line array to achieve a two dimensional suppression of interfering signals in both elevation and azimuth directions while producing a pencil shaped beam in the direction of the desired signal.

What is claimed is:

1. An adaptive signal processing array, comprising
   (a) a plurality of signal detectors (40–44) for producing a plurality of detector signals, respectively;
   (b) means connected with said detectors for adjusting said signals from a preferred direction for like phase;
   (c) means for producing difference signals (46) for remaining detector signals;
   (d) a plurality of first variable weight adaptive filters (48) connected with all but one of said difference signal producing means, thereby to produce a plurality of weighted difference signals;
   (e) first adder means (50) connected with said filters for combining said weighted difference signals;
   (f) first differencing means (52) for differencing said weighted difference signals and one unweighted difference signal;
   (g) unconstrained adaptive signal processor means (58) connected with said differencing means for adjusting variable weights of said adaptive filters in response to the difference between said weighted difference signals and said one unweighted difference signal;
   (h) a plurality of second adder means (70) connected with subgroups of said signal detectors to form a plurality of subgroups of detector signals, respectively;
   (i) a plurality of second simple weighted filters (76) connected with all but one of said second adder means, said second filters also being connected with said first adaptive filters, respectively, whereby said second simple filters are weighted by said first adaptive filters to produce further weighted signals;
   (j) third adder means (79) connected with the outputs of said second filters for combining said further weighted signals; and
   (k) second differencing means (80) for differencing said further weighted signals and one unweighted subgroup of detector signals; and
   (l) means (84) connected with said second differencing means for conditioning an output thereof to recover an undistorted desired signal.

2. A processing array as defined in claim 1, and further comprising first and second delay means connected with said one difference signal producing means and said one second adder means for delaying said unweighted difference signal and said unweighted subgroup of detector signals, respectively.

3. A method for unconstrained adaptive signal processing from an array of signal detectors for suppressing coherent and non-coherent interfering signals, comprising the steps of
   (a) producing difference signals between signals from successive detectors;
   (b) weighting all but one of said difference signals using adaptive filters;
   (c) delaying an unweighted difference signal;
   (d) differencing said weighted and delayed unweighted difference signals;
   (e) adjusting the weights of adaptive filters in accordance with the difference between said weighted and delayed unweighted difference signals;
   (f) combining groups of signals from the detectors to form a plurality of subgroups of detector signals;
   (g) weighting all but one of said subgroups of signals in accordance with the adjusted weights to,produce further weighted signals;
   (h) combining said further weighted signals;
   (i) differencing said further weighted signals and one unweighted subgroup of detector signals to produce a difference output; and
   (j) conditioning said difference output to recover an undistorted desired signal.

4. A method as defined in claim 3, and further comprising the step of limiting the number of said difference signals to one more than the number of interfering signals.

5. A method as defined in claim 4, wherein said conditioning step comprises processing said differencing output as the inverse of the Z transform relation given by $$Z^{-q} - \{H_1(Z) + H_2 + \ldots + H_k(Z)\}$$

where $H_1$–$H_k$ are the weights provided by K adaptive filters; and $Z^{-q}$ is the delay applied to the unweighted difference signal.

6. A method as defined in claim 4, and further comprising the step of providing a minimum number of said variable weights for said adaptive filters by providing and delaying said last difference signal.

* * * * *